United States Patent
Leinkram

[15] 3,660,632

[45] May 2, 1972

[54] METHOD FOR BONDING SILICON CHIPS TO A COLD SUBSTRATE

[72] Inventor: Charles Z. Leinkram, Bowie, Md.

[73] Assignee: The United States of America as represented by the Secretary of the Navy

[22] Filed: June 17, 1970

[21] Appl. No.: 47,071

[52] U.S. Cl. ....................................219/85, 29/497, 29/498, 29/590, 29/626

[51] Int. Cl. ........................................B23k 1/02, B23k 1/04

[58] Field of Search ...............29/498, 497, 590, 626; 219/85

[56] References Cited

UNITED STATES PATENTS

| | | | |
|---|---|---|---|
| 3,025,439 | 3/1962 | Anderson | 29/590 X |
| 3,050,667 | 8/1962 | Emeis | 29/590 X |
| 3,197,608 | 7/1965 | Ingraham | 219/85 |
| 3,274,667 | 9/1966 | Siebertz | 29/498 X |
| 3,340,602 | 9/1967 | Honty | 29/498 X |
| 3,374,530 | 3/1968 | Flanders et al. | 219/85 X |
| 3,418,422 | 12/1968 | Bradham | 29/626 X |
| 3,544,704 | 12/1970 | Glenn, Jr. | 29/626 X |

OTHER PUBLICATIONS

Chiou, et al., " Localized Heating of Chip Bonding Pad," IBM Technical Disclosure Bulletin, Vol. 9, No. 8, January, 1967, pp. 1051- 1052.

*Primary Examiner*—John F. Campbell
*Assistant Examiner*—Ronald J. Shore
*Attorney*—R. S. Sciascia, Arthur L. Branning, James G. Murray and John M. Neary

[57] ABSTRACT

A method for bonding silicon chips to a cold substrate including the steps of mounting the chip on a gold plated Kovar tab; placing a solder preform on a gold lane of the substrate, positioning the tab on the solder preform, and passing a welding pulse through the Kovar tab to melt and reflow the solder preform.

10 Claims, 2 Drawing Figures

INVENTOR
CHARLES Z. LEINKRAM

BY

ATTORNEYS

METHOD FOR BONDING SILICON CHIPS TO A COLD SUBSTRATE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to eutectic adhesion between semi-metallic heat sensitive substances, and more particularly, to eutectic adhesion of silicon chip devices to an alumina substrate.

The fabrication of modern hybrid micro-electronic circuits typically starts with an alumina substrate coated with a deposit of gold which may be extremely thin, on the order of 2000 Angstroms. A photo resist composition is then applied to the gold surface and is exposed to ultraviolet radiation through a suitable mask. The photo resist is then developed and the areas of gold coating which are not protected by resist that is hardened and developed in the process are etched by a suitable etching composition. This process leaves a circuit of the desired configuration interspersed by gold land areas on which the suitable electrical devices such as resistors, transistors, diodes, etc. are to be fixed.

A typical substrate may be 1 inch square and contain 100 or more electrical devices. Consequently it is apparent that the gold land areas must be very small and the technique for bonding the electrical devices to the gold land areas must be extremely precise. The narrow clearance between the gold land areas and adjacent gold conductors on the substrate makes the hazard of short circuits therebetween acute, and has constituted a critical and chronic problem for the industry.

To avoid the problem of unwanted short circuits due to sloppy soldering techniques it was proposed to manually scrub the chip against the gold land areas at an elevated temperature. This technique provided a good bond but it was found that smearing of the gold land areas due to the scrubbing often produced short circuits with adjacent conductors. Moreover, in extremely thin gold films of the order of 2000 Angstroms, it was found that often the gold land areas would merely abrade and a good bond would not be formed. Finally, it was necessary to hold the substrate at the elevated operating temperatures required for the process during the entire assembly time. Thus, the first electrical element would be exposed to this extreme temperature while all the other one hundred or so elements were mounted on the substrate, a process which could take several hours. The extended heating resulted in a degradation of the gain of the transistor i.e. the D.C. beta, particularly at low base drive current levels. Thus, where a D.C. beta of 100 at a particular base drive current level was read initially, a D.C. beta reading of the transistor after bonding the complete substrate would be down to 30 or less. This often resulted in such deterioration of performance that the entire hybrid circuit would have to be discarded. Indeed, a reject rate of 80 percent was not uncommon.

To solve the problem of smearing of the gold land areas to adjacent conductors, it was proposed to use ultrasonic bonding of the chip to the gold land area. This technique eliminated the gold land smearing, but did not appreciably decrease the fabrication time, hence at elevated temperature the thermal degradation of the beta remained a problem. In addition it was found that the mechanical bond of the chip to the substrate was unacceptably weak and the technique was rejected.

Various soldering techniques have been proposed but all suffer from thermal degradation of the beta because of extended assembly times at elevated temperatures. In addition unless a gold-silicon eutectic is used, the high temperature eutectic will, within a short time, dissolve the gold from the gold land areas leaving a non-wet interface between the gold eutectic and the alumina substrate and consequently an extremely weak mechanical bond. One final problem encountered is the formation of a dross on the solder at high temperatures in the absence of an inert gas shield. This dross tends to flake off and can form unwanted electrical bridges on the circuit if not carefully cleaned off.

The art therefore has long been in search of a method for mounting electrical devices to a thin gold land area of a substrate which does not require an extended heating period and forms strong mechanical bonds with good thermal and electrical paths and is amenable to high production rates.

SUMMARY OF THE INVENTION

It is therefore an object of this invention to provide a method of mounting electrical devices to a thin gold film of a substrate in which no thermal degradation of electrical device is sustained.

Another object of the present invention is to provide a method of adhering semi-metallic devices to a semi-metallic substrate which produces excellent mechanical bonds and provides low resistance thermal and electrical paths.

Yet another object of the instant invention is to provide a method for eutectic bonding of semi-metallic chips to a semi-metallic gold coated substrate in which the gold coating is not dissolved by the eutectic.

A yet further object of the present invention is to provide a method of bonding semi-metallic chips to a semi-metallic gold coated substrate free of dross production and amenable to high volume, low cost production rates.

These and other objects of the invention are attained by providing a method of bonding chips to a substrate including the steps of mounting the chip device on a gold plated Kovar tab, positioning a solder preform on the proper gold land area of the substrate, placing the tab on top of the preform, passing a short pulse of electrical current through the Kovar tab to momentarily raise its temperature above the eutectic temperature and reflow the solder to produce the eutectic bond.

DESCRIPTION OF THE DRAWINGS

A more complete appreciation of the invention and its many attendant advantages will develop as the same becomes better understood by reference to the following detailed description when considered in connection with the accompanying drawings wherein.

Figure 1:
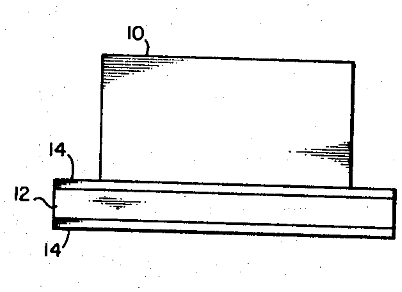
FIG. 1 is an elevation, greatly enlarged, showing the electrical device mounted on a gold plated Kovar tab.
Figure 2:
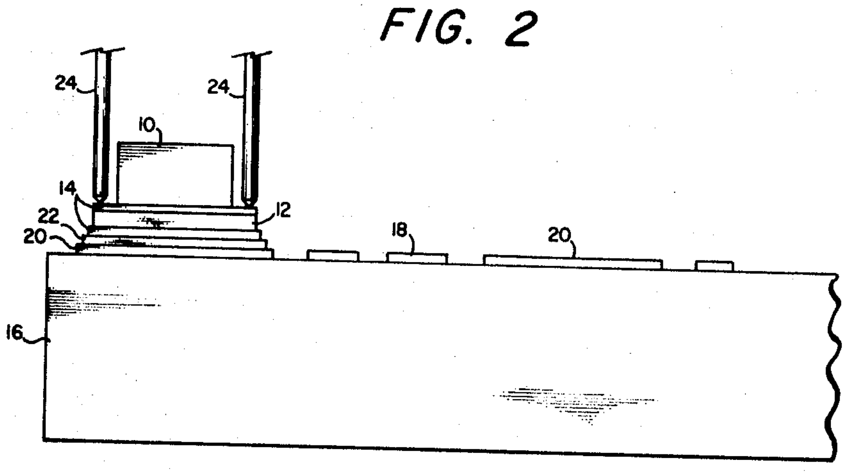
FIG. 2, also greatly enlarged, shows the chip and tab assembly in place on the substrate with a solder preform sandwiched inbetween and the welding electrodes in place.

Referring now to the drawings wherein like reference characters designate identical or corresponding parts throughout the several views and more particularly to FIG. 1 thereof, the electrical device 10 such as a silicon diode or transistor is shown mounted on a Kovar tab 12 plated on both sides with a heavy layer of gold 14. This assembly can be purchased commercially in pre-assembled form from numerous manufacturers and is a stock item.

The substrate could be a printed circuit board but is particularly well suited for a glazed alumina substrate shown having deposited on the top surface thereof a plurality of conductors 18 which comprise the circuit of the substrate, and having interspersed at appropriate places in the circuit a plurality of gold land areas 20. These gold conductors 18 and gold land areas 20 may be of an extremely thin gold layer on the order of 2000 Angstroms. The circuit and gold land areas are formed on the substrate 16 by conventional vacuum depositing and photo etching techniques well known in the art.

A solder preform 22 is placed on the proper gold land area 20 and the Kovar tab-transistor assembly 10–12 is placed on top of preform 22. A pair of electrodes 24 is placed on the outside edges of Kovar tab 12 bracketing chip 10 and pressure is applied to Kovar tab 12 through electrodes 24 while a short welding pulse of electricity is fired through tab 12 by way of the electrodes. The welding pulse momentarily raises the temperature of the Kovar tab above the eutectic temperature of the solder preform 22, causing the solder to reflow, while the pressure exerted by the electrodes overcomes the surface tension of the molten solder and breaks through any oxide film enabling the tab to sit parallel with the substrate and allowing formation of a firm solder bond. The location of welding electrodes 24 on tab 12 is not critical, provided they are near the outside opposite edges of the tab and are not in contact with chip 10. This insures that the welding pulse will pass through the tab along its entire length raising it to eutectic temperature and causing solder reflow over the entire surface of the tab.

The welder used in this embodiment was a Unibond 1–124–02 parallel gap welder made by the Unitek Co. of California. The settings on the machine which produced an optimum weld schedule were 1.89 volts, modulation setting 4.0, manual mode setting 20, and pressure setting of 5.7. The solder preform was a gold-tin eutectic flake 1 mil thick. One of the principal unexpected advantages achieved by this invention was the absence of solution of the gold land areas by the gold-tin eutectic which tends to be gold hungry and will dissolve gold from the gold land area if exposed to eutectic temperatures for very long. Since the eutectic temperature is experienced for only a very short moment, there is no solution of gold from the gold land areas and the eutectic bond remains extremely strong.

The same technique was used with a gold-silicon solder preform 2 mils thick. Because of the higher melting temperature of the gold-silicon solder, a new weld schedule was required and the optimum settings were found to be 1.5 volts, 6.5 modulation setting, manual mode 20, and pressure setting of 5.7. The additional heat generated at this higher setting melted the solder bond between the chip 10 and tab 12 but this momentary melting did not adversely affect the solder bond therebetween and subsequent tests confirmed the continued high strength of the bond.

Gain measurements at 1 micro-amp base drive were taken on both NPN and PNP transistor chips before and after the welding pulse and solder reflow. The results of these test, shown in Table 1, clearly show that the use of the parallel gap welder to reflow the solder does not alter either the NPN or PNP transistor gains at low base current levels and produces a bond between the Kovar tab and the substrate strong enough, in every case, to resist a shear force of 500 grams. Table I - Test results of Transistor Chips mounted on Kovar tabs before and after Parallel Gap Welding showing the D.C. Beta at 1 micro-amp base current using Au-Sn or Au-Si eutectic.

| NPN (2N2222) | D.C. Beta, using Au-Sn eutectic | | D.C. Beta, using Au-Si alloy | |
|---|---|---|---|---|
| | Before Weld | After Weld | Before Weld | After Weld |
| 1 | **40** | **40** | **65** | **65** |
| 2 | **65** | **65** | **35** | **35** |
| 3 | **66** | **68** | **150** | **130** |
| 4 | **70** | **70** | **45** | **45** |
| 5 | **42** | **42** | **150** | **145** |
| 6 | **100** | **105** | **30** | **25** |
| 7 | **80** | **85** | **85** | **80** |
| 8 | **95** | **95** | **10** | **35** |
| 9 | **150** | **150** | **50** | **60** |
| 10 | **65** | **50** | **100** | **100** |
| PNP (2N2907) | | | | |
| 1 | **80** | **80** | **110** | **110** |
| 2 | **75** | **70** | **125** | **120** |
| 3 | **150** | **155** | **75** | **85** |
| 4 | **115** | **110** | **120** | **120** |
| 5 | **130** | **135** | **135** | **135** |
| 6 | **90** | **90** | **115** | **120** |
| 7 | **110** | **115** | **140** | **145** |
| 8 | **100** | **100** | **120** | **120** |
| 9 | **125** | **125** | **135** | **135** |
| 10 | **135** | **140** | **115** | **115** |

Because of the extremely short duration of the heating phase produced by the welding pulse, the only limit upon packing density on the substrate is spatial, and, in power applications, that imposed by the heat dissipation capacity of the substrate. The substrate remains cold during the entire assembly process and once the chip-tab assembly has been mounted to the substrate and has experienced its momentary rise in temperature, it never again sees the high eutectic bonding temperature. The extended exposure to high temperatures required by prior art assembly procedures which has resulted in such problems in the industry is now rendered unnecessary.

The process is also useful for bonding a metal oxide semiconductor field effect transistor which may be damaged by exposure to the electric field between two high voltage electrodes. Since the welding pulse is a high current — low voltage event the MOSFET is not exposed to a high voltage electric field and is not damaged.

Obviously numerous modifications and variations of the present invention are possible in the light of the above teachings. It is therefore to be understood that within the scope of the appended claims the invention may be practiced otherwise than as specifically described herein.

What is claimed and desired to be secured by Letters Patent of THE UNITED STATES is:

1. A process for bonding a heat sensitive electrical device to a substrate, comprising:
forming an assembly by mounting said device on a gold plated Kovar tab;
depositing a gold land on said substrate;
positioning a gold alloy solder preform on said gold land;
placing said assembly on said solder preform;
placing a pair of electrodes on said tab bracketing said device;
applying pressure to said tab through said electrodes and simultaneously heating by causing a pulse of electric current to flow along said tab via said electrodes sufficient to melt said solder preform;
wherein said steps of applying pressure and heating comprise said bonding step.

2. The process defined in claim 1 wherein said solder preform comprises a flake of 98 percent gold—2 percent silicon alloy 2 mils thick.

3. The process defined in claim 1 wherein said solder preform comprises a flake of gold-tin alloy 1 mil thick.

14. The process defined in claim 1 wherein said pressure is that needed to hold said assembly in place and to overcome the surface tension of the fused solder.

5. The process defined in claim, wherein:
said substrate comprises glazed alumina; and
said solder preform comprises a gold-tin eutectic flake.

6. The process defined in claim 1, wherein:
said Kovar tab comprises portions extending beyond the edges of said device;
said electrodes are placed on said portions and are spaced from said device while said current flows through said electrodes and along said tab.

7. The process defined in claim 6, wherein:
said substrate comprises glazed alumina; and
said solder preform comprises a gold-tin eutectic flake.

8. The process defined in claim 7, wherein:
said pressure is sufficient to hold said assembly in place while the solder preform is fused, and also sufficient to overcome the surface tension of the fused solder.

9. The process defined in claim 8 wherein:
said gold land comprises a thin film deposit of approximately 2000 Angstroms thick.

10. The process defined in claim 9, wherein:
said process for bonding is carried out in the air.

* * * * *